United States Patent
Evans et al.

(10) Patent No.: US 6,714,308 B2
(45) Date of Patent: Mar. 30, 2004

(54) RAPID IN-SITU MASTERING OF AN ASPHERIC FIZEAU

(75) Inventors: Christopher James Evans, Higganum, CT (US); Michael Küchel, Oberkochen (DE)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 10/233,772

(22) Filed: Sep. 3, 2002

(65) Prior Publication Data

US 2003/0048457 A1 Mar. 13, 2003

Related U.S. Application Data (60) Provisional application No. 60/317,028, filed on Sep. 4, 2001.

(51) Int. Cl.[7] .................................................. G01B 9/02
(52) U.S. Cl. ...................................... 356/513; 356/512
(58) Field of Search ................................ 356/511, 512, 356/515, 513, 489, 495, 514

(56) References Cited

U.S. PATENT DOCUMENTS 5,004,346 A    4/1991  Kühel
5,416,586 A  * 5/1995  Tronolone et al. .......... 356/513
2001/0028462 A1  10/2001  Ichihara et al.

OTHER PUBLICATIONS

Lin, Ding–tin, and Wan, Der–Shen. "Profile Measurement Of An Aspheric Cylindrical Surface From Retroreflection." Applied Optics, vol. 30, No. 22 (Aug. 1, 1991): pp. 3200–3204.
Dorband, B. et al. "High Precision Interferometric Measurements Of Lens Elements." Fringe '97: Proceedings of the 3rd International Workshop on Automatic Processing of Fringe Patterns Held in Bremen, Germany, Sep. 15–17, 1997. pp. 473–480.

* cited by examiner

Primary Examiner—Frank G. Font
Assistant Examiner—Patrick Connolly
(74) Attorney, Agent, or Firm—Francis J. Caufield (57) ABSTRACT

Interferometric apparatus and methods by which aspheric surfaces and wavefronts may be precisely measured. The apparatus is provided with two modes of operation. In one mode, the apparatus is configured generally as a Fizeau interferometer in which an aspheric reference surface is used to permit the rapid, robust measurement of the difference between the aspheric reference surface and an aspheric test optic or wavefront. In another mode of operation, the aspheric test surface itself is completely characterized through in-situ use of an interferometric scanning technique using a spherical reference surface.

15 Claims, 7 Drawing Sheets

RAPID IN-SITU MASTERING OF AN ASPHERIC FIZEAU

CROSS REFERENCE TO RELATED APPLICATION

This application claims priority from U.S. Provisional Patent Application No. 60/317,028 filed on Sep. 4, 2001 in the name of Christopher James Evans, et al. with the title "RAPID IN-SITU MASTERING OF AN ASPHERIC FIZEAU", the entire contents of which are incorporated herein by refeence.

FIELD OF THE INVENTION

In general, this invention relates to the field of interferometry and, in particular, to the high accuracy measurement of aspherical surfaces and wavefronts in an absolute manner.

BACKGROUND OF THE INVENTION

Aspheric surfaces offer significant advantages to the designer of optical systems, but their use has been constrained by difficulties in manufacture and measurement. Next generation lithography tools are being designed with aspheric mirrors and lenses with apertures approaching 0.5 meters with tolerances on the surface shapes of less than a nanometer. One approach to providing the measurements necessary during the production of these optical elements is to use a Fizeau interferometer with an aspheric reference surface such as that described in U.S. Provisional Patent Application No. 60/299,512 filed on Jun. 20, 2001 in the name of Carl A. Zanoni and entitled "APPARATUS AND METHOD FOR MEASURING ASPHERICAL OPTICAL SURFACES AND WAVEFRONTS", which was converted to regular U.S. patent application Ser. No. 10/152,075 filed on May 21, 2002 and published on Jan. 1, 2003 as US-2003-0002048-A1. The reference surface of such an aspheric Fizeau must itself be calibrated, typically in a separate instrument. Dismounting the reference element from the calibration instrument and remounting it in the production tester (Fizeau) may lead to deformations and poses risks during handling. Further, this approach to calibration measures only the reference surface, not the entire instrument performance. Another disadvantage of separate calibration schemes is that the difficulties they pose dissuade instrument users from frequent recalibration (remastering). When measurement uncertainties of a small fraction of a nanometer are required, it is advantageous to remaster the system frequently.

Interferometric testing of aspheric optics using "null correctors" is widely performed, as the fabricators of the Hubble telescope taught (inadvertently), but this approach simply transfers the calibration problem from the optic to the null. Approaches that do not require a null have long been sought.

Michael Küchel in U.S. Pat. No. 5,004,346 issued on Apr. 2, 1991 and Mark J. Tronolone, et al. in U.S. Pat. No. 5,416,586 issued on May 16, 1995 describe techniques where an aspheric surface (or wavefront) is characterized by scanning with respect to a spherical wavefront and collecting data in zones. Uncertainty in the measurement arises, inter alia, from uncertainty in the lateral coordinate at which each zone is collected. New methods and analysis introduced by Michael Küchel in U.S. Provisional Patent Application No. 60/303,856 filed on Jul, 9, 2001 and entitled "SCANNING INTERFEROMETER FOR ASPHERIC WAVEFRONTS AND WAVEFRONTS", converted to U.S. patent application Ser. No. 10/180,286 filed on Jun. 26, 2002 and published on Mar. 6. 2003 as US-2003-0043385-A1, eliminate this problem: Küchel in the foregoing provisional patent application shows the scanning of aspheric surfaces with respect to spherical wavefronts, and vice versa. All scanning techniques, however, are relatively slow. Zanoni in the foregoing U.S. Provisional Patent Application No. 60/299,512, now U.S. patent application Ser. No. 10/152, 075 (US-2003-0002048-A1) introduced the concept of using an aspheric reference surface in a Fizeau interferometer to allow rapid, robust measurement of the difference between the reference and a test optic; such a scheme requires a technique for calibrating the reference.

It is an object of this invention to provide in-situ calibration of the performance of an aspheric Fizeau interferometer.

It is a further object of this invention to integrate the systems needed for calibration into an aspheric Fizeau to facilitate rapid, frequent remastering.

Other objects of the invention will be obvious and will appear hereinafter when the detailed description is read in connection with the accompanying drawings.

SUMMARY OF THE INVENTION

Interferometric apparatus and methods by which aspheric surfaces and wavefronts may be precisely measured. The apparatus is provided with two modes of operation. In one mode, the apparatus is configured generally as a Fizeau interferometer in which an aspheric reference surface is used to permit the rapid, robust measurement of the difference between the aspheric reference surface and an aspheric test optic or wavefront. In another mode of operation, the aspheric test surface itself is completely characterized through in-situ use of an interferometric scanning technique using a spherical reference surface.

In one aspect, the invention comprises an interferometric method for measuring rotationally and non-rotationally symmetric optics. The method comprises the steps of: scanning at least one aspheric reference surface with a spherical reference surface to determine the shape of the aspheric reference surface; aligning a test optic to be measured with the aspheric reference surface placed closely adjacent the test optic by a predetermined distance; illuminating the at least one reference aspherical surface with a beam having a predetermined wavefront such that part of the predetermined wavefront is reflected from the reference aspherical surface to serve as reference wavefront and part is transmitted as a continuing aspherical wavefront that impinges on the test optic and returns therefrom as a measurement wavefront that travels back towards the reference aspherical surface; and combining the reference and measurement wavefronts to form an interferogram containing phase information indicative of the shape of the wavefront generated by the test optic.

In another aspect, the invention comprises an interferometric apparatus for measuring rotationally and non-rotationally symmetric test optics. The interferometric apparatus comprises: means for mounting a test optic to be measured so that it can be illuminated as it is precisely aligned; means for scanning an aspheric reference surface to precisely determine its shape; means for aligning the reference aspherical surface closely adjacent the test optic to be measured and spaced therefrom by a predetermined distance; and means for illuminating the reference aspherical surface with a beam having a predetermined wavefront whose shape is substantially the same as that of the reference aspherical surface so that part of the predetermined wavefront is reflected from the reference aspherical surface to serve as reference wavefront and part is transmitted as a continuing aspherical wavefront that impinges on the test optic and returns therefrom as a measurement wavefront that travels back towards the reference aspherical surface, the reference and measurement wavefronts combining to form an interferogram containing phase information indicative of the shape of the wavefront generated by the test optic.

BRIEF DESCRIPTION OF THE DRAWINGS

The structure, operation, and methodology of the invention, together with other objects and advantages thereof, may best be understood by reading the detailed description in conjunction with the drawings in which each part has an assigned numeral that identifies it wherever it appears in the various drawings and wherein.

DETAILED DESCRIPTION OF THE INVENTION

The present invention relates to interferometric apparatus and methods by which aspheric surfaces and wavefronts may be accurately measured. The apparatus of the invention is configured to operate in two modes. In one mode, a spherical reference optic is scanned in front of an aspheric Fizeau to calibrate the apparatus in exactly the configuration in which it is to be used for measurement purposes. Afterwards, the scanning stage is then translated so that an aspheric test piece can be located in position for direct comparative measurement.

Figure 1:
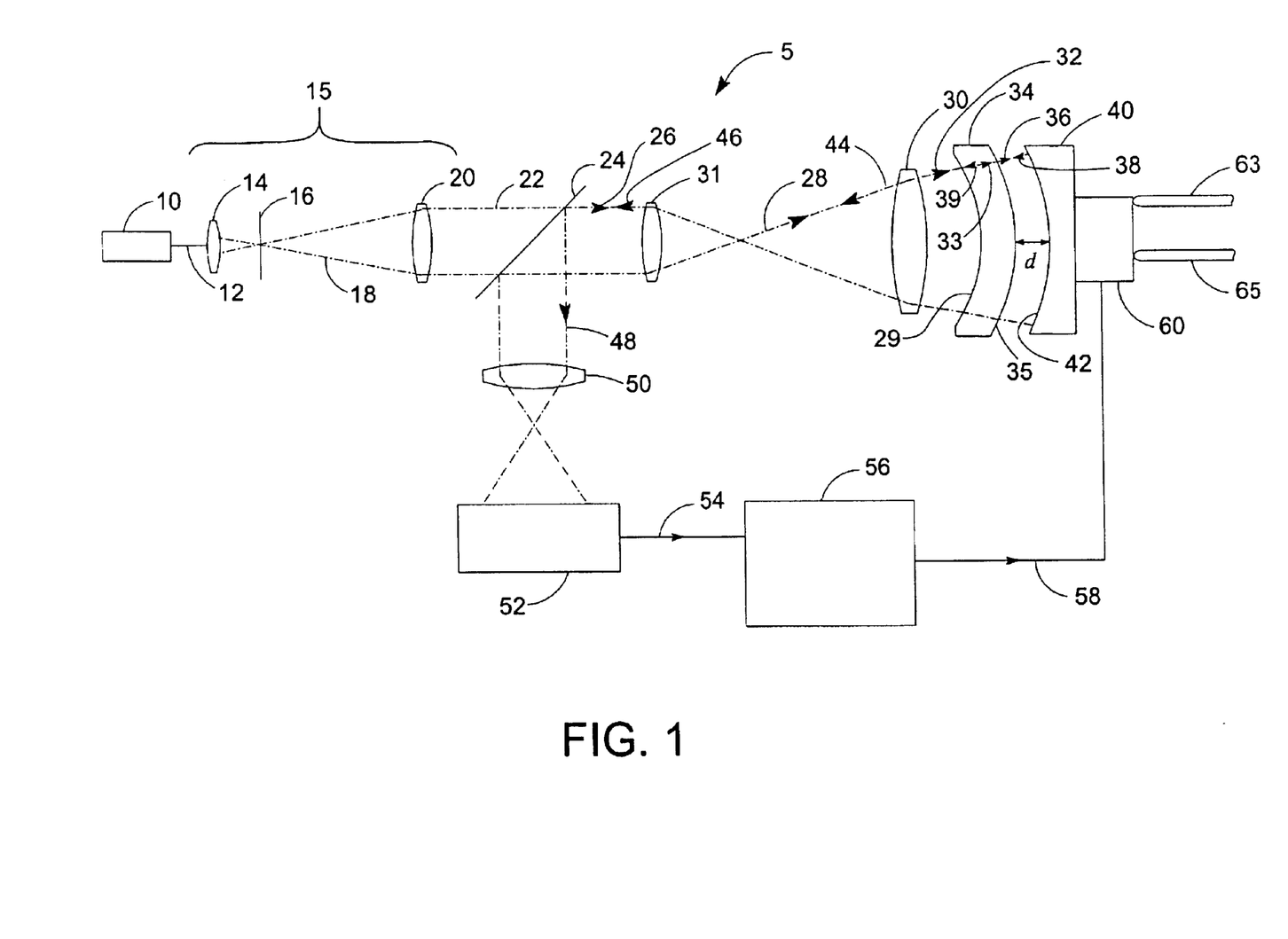
FIG. 1 is a diagrammatic view of the invention shown configured for measuring an aspherical surface.

Reference is now made to FIG. 1 which shows an interferometric apparatus of the invention configured in its comparative measurement mode to accurately measure aspherical surfaces, particularly of the type required for use in lithographic applications operating in the ultraviolet and extreme ultraviolet regions of the spectrum. As seen in FIG. 1, the interferometric apparatus of the invention is depicted as an interferometric system designated generally at 5. The major components of system 5 comprise a light source 10 for generating an output beam 12, an illuminator 15 for receiving output beam 12 and generating an output beam 22, a beamsplitter 24, an optical system comprising elements 30 and 31 and, as needed, portions of an element 34 that carries a front surface 35 in the form of an aspherical reference surface, a two-dimensional photodetection system 52, and a multi degree of freedom mounting system 60 for precisely controlling the position and attitude of a component under test, which is designated generally as 40. The mounting system 60 is preferably a 6-axis mount (only 5 axes are essential, but the sixth—rotation about the optical axis—is helpful). Distance measuring interferometers 63 and 65 are provided for use in precisely setting the distance between the test and reference surfaces and performing translations in the calibration or remastering mode of operation of system 5. A general purpose computer 56 or dedicated microprocessor is provided for performing analytical tasks, general housekeeping functions, and an interface for an operator to issue commands to system 5 so that it can perform its functions in an orderly fashion.

Light source 10 is preferably a laser having an output wavelength that is selected based on the reflectivity of a surface under test, and may be either cw or pulsed. The coherence length of the light source 10 is chosen to be at least equal to or greater than 2d. For an application of the embodiment being described, the coherence length is preferably on the order of between 5 mm to 10 mm.

Illuminator 15 comprises a converging lens 14 that focuses beam 12 onto a pinhole 16 beyond which this focused beam expands to impinge on a collimator lens 20 to provide a collimated beam 22 having a substantially plane wavefront. Illuminator 15 preferably is artifact free in the manner of, for example, the source described in U.S. patent application Ser. No. 09/848,055 filed on May 3, 2001 with the title "APPARATUS AND METHOD(S) FOR REDUCING THE EFFECTS OF ARTIFACTS IN AN INTERFEROMETER and published on Mar. 6, 2003 as US-2003-0043380-A1, the contents of which are incorporated herein by reference in their entirety, or may not require a pinhole, if other components of the system accommodate the use of other than plane waves in the otherwise collimated space following collimator lens 20.

Beamsplitter 24 is placed in the collimated space between collimator lens 20 and a converging lens 31 and is structured to transmit collimated beam 26 upstream for subsequent use and to reflect return beams toward photodetection system 52.

Figure 2:
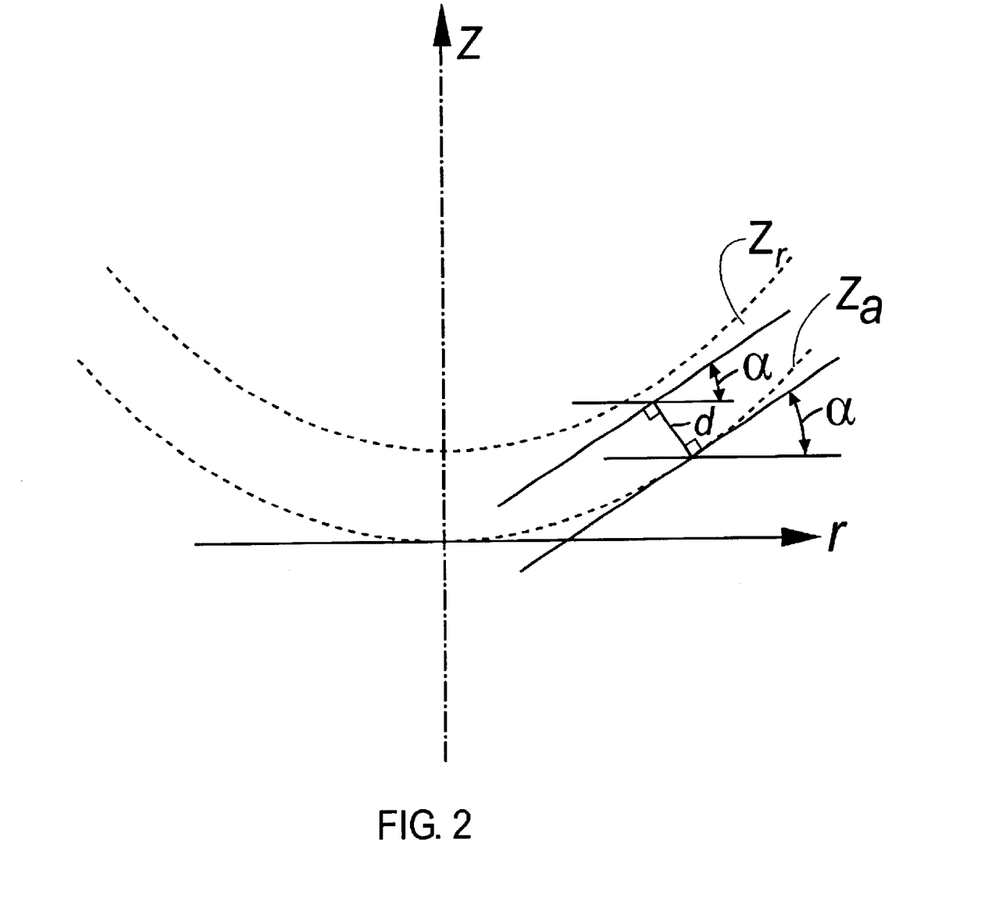
FIG. 2 is a diagram illustrating the properties and relationships among various surfaces appearing in FIG. 1.

Element 34 carries as its front surface an aspherical reference surface 35 designated as $Z_R(r)$ in FIG. 2, and test element 40 carries as its rear surface an aspherical surface 42 designated as $Z_a(r)$ in FIG. 2. $Z_a(r)$ is the equation of the aspherical surface under test 42, and its nominal shape and tolerances are known from the optical design. The slope of $Z_a(r)$ is obtained by differentiation to give:

$$\tan \alpha(r) = dZ_a(r)/dr \quad (1)$$

As can be seen from FIG. 2, the shape of the reference surface 35 is given by:

$$Z_r(r) = Z_a(r + d \sin \alpha) + (d \cos \alpha) \quad (2)$$

The reference aspherical surface 35 may be fabricated using well-known techniques. It is preferably measured in-situ in system 5 when it is configured in its calibration or remastering mode to be described hereinafter. Testing of aspheric reference surface 35 is preferably done using the previously mentioned scanning technique described in U.S. Provisional Patent Application No. 60/303,856 filed on Jul. 9, 2001 in the name of Michael Küchel and entitled "SCANNING INTERFEROMETER FOR ASPHERIC WAVEFRONTS AND WAVEFRONTS", now converted to U.S. patent application Ser. No. 10/180,286 filed on Jun. 26, 2002 and published on Mar. 6. 2003 as US-2003-0043385-A1; the entire contents of which is incorporated herein by reference.

Thus, system 5 comprises an interferometer, preferably a Fizeau interferometer, having an optical system which contains an aspherical reference surface 35. Aspherical reference surface 35 is illuminated by an incident aspherical wavefront 33 generated by optics located upstream of it; namely, the combination of lenses 30, 31, and a rear surface 29 of element 34. Lens 31 operates on collimated beam 26 (plane wavefront) to converge it after which it proceeds towards lens 30 as a diverging wavefront 28. Lens 30 operates on wavefront 28, further shaping it so that it emerges from lens 30 as wavefront 32. Wavefront 32 then encounters the rear surface 29 of element 34 and then impinges on reference surface 35 as aspherical wavefront 33. In this manner, the foregoing combination of elements is designed to operate on collimated beam 26 to provide an incident aspherical wavefront 33 that is normal to the aspherical reference surface 35.

The aspherical reference surface 35 acts as both a beamsplitter and a reference surface for the interferometer. The aspherical reference surface 35 reflects a portion of the incident aspherical wavefront 33 into a reference wavefront 39 and transmits a portion of the incident aspherical wavefront 33 into an aspherical measurement wavefront 36.

The aspherical reference surface 35 and the aspherical surface under test 42 are preferably separated by a small distance, d, so as to minimize environmentally induced measurement errors and noise and higher order errors in the measurement resulting from errors in the aspherical shape of the wavefront impinging on surface 35. The aspherical measurement wavefront 36 propagates normal to and is reflected by the aspherical surface under test 42, and the reflected aspherical measurement wavefront 38 is combined with the reference aspherical wavefront 39 to form an interferogram which is indicative of the shape of the aspherical surface under test. For this purpose, the two interfering beams should be nearly the same intensity to provide maximum fringe contrast.

The combined interfering wavefront is more or less distorted wavefront initially inside of element 34 and thereafter travels as wavefront 44 that proceeds through element 31, emerging therefrom as wavefront 46. Wavefront 46 is reflected downwardly by beamsplitter 24 as wavefront 48, which is thereafter imaged via lens 50 onto photodetection system 52 as the final interferogram. Photodetection system 52 is preferably two-dimensional, having a two-dimensional photosensitive array, and may be in the form of a shuttered or unshuttered electronic, video, or solid state camera provided with a CCD, or the like. A zoom lens also may be used under appropriate conditions, and rotating ground glass or similar coherence busters may be used either before the camera or in the path of the light source The output of photodetection system 52 is fed to computer 56 as electrical signal 54.

The phase of the resulting interferogram is modulated, preferably by wavelength modulation, using any of the well-known techniques for this purpose. In the instant invention, angular and positional alignment of the aspherical surface 42 under test to the aspherical reference surface 35 is done by analysis of the interferogram through the use of well-known algorithms resident as computer instructions on computer 56. Position and attitude of test element 40 is preferably made via a well-known positioning device 60 under control of computer 56 and provided with, for example, five to six degrees of freedom to control translation and angular orientation of element 40, and thus test surface 42. In this manner, the aspherical surface 42 under test can be mechanically aligned with coarse and fine positioning actuators which can be under either manual or computer control. Analysis of the final interferogram provides values of any residual misalignments. DMIs 63 and 65 are used to provide precise distance measurements to assist in alignment.

Figure 3:
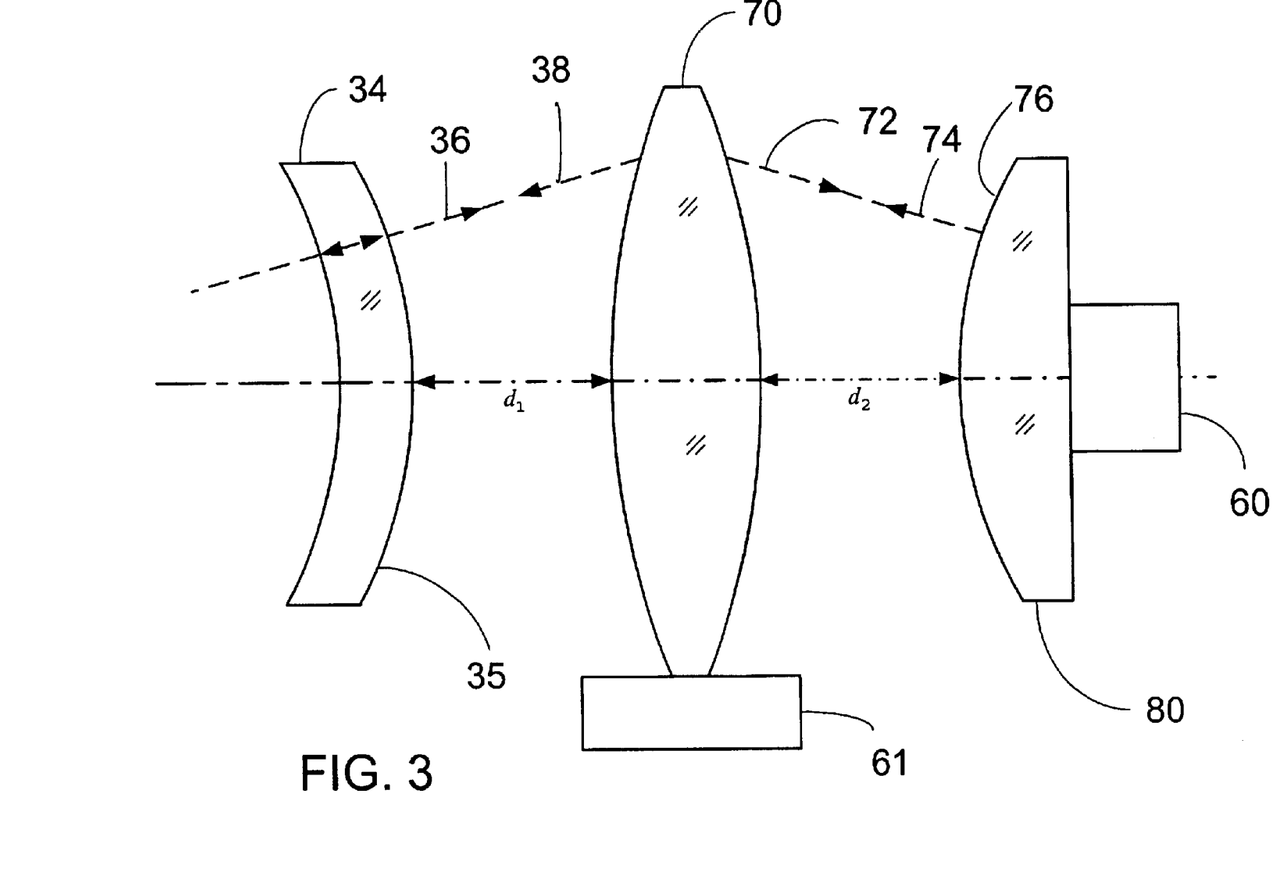
FIG. 3 is a diagrammatic drawing of portions of an embodiment of the invention for measuring the transmitted wavefront through one or more refracting optical elements.

Referring now to FIG. 3, there is shown an arrangement of the invention by which a refractive element or group of refractive elements such as those, e.g., found in a lithographic lens for fabricating integrated circuits, or the like, may be measured. Such refracting systems may include aspherical surfaces or not and may have incident aspherical wavefronts or emergent transmitted aspherical wavefronts. The refractive element to be measured is designated diagrammatically at 70 and is mounted on a well-known positioning device 61 between reference elements 34 and 80. As before, positioning device 61 is under the control of computer 56. Reference element 34 carries an aspherical reference surface 35, and reference element 80 carries an aspherical reference surface 76. Reference aspherical surfaces 35 and 76 are not necessarily identical. As before, an aspherical wavefront 36 of well-defined shape is provided and is directed through test element 70 after which it emerges as wavefront 72. Wavefront 72 is reflected off aspherical reference surface 76 as wavefront 74. Surface 76 is configured so that wavefront 72 strikes it at normal incidence over its entire surface. Wavefront 74 emerges from element 70 as wavefront 38, which is combined with a reference aspherical wavefront to form an interferogram as before. Aspheric wavefront 36 and the shape of surfaces 35 and 76 are obtained based on the optical design of refractive element 70 as are the spacings $d_1$ and $d_2$ shown in FIG. 3. The interferogram is imaged and analyzed in the manner previously described in connection with FIG. 1 to determine the shape of the wavefront transmitted by element 70 and compare it with its ideal. Positioning devices 60 and 61 may be used throughout for alignment and measurement purposes.

Here, light source 10 is preferably a laser having an output wavelength at or near the operating wavelength of the component to be tested, typically 193 nm, 157 nm, or 13.6 nm, and may be either cw or pulsed.

To align elements 34 and 80, a master element 70 is first made to required precision and then the master is placed in the measurement station and elements 34 and 80 are appropriately adjusted to desired alignment. Afterwards, the master is removed and replaced with test elements.

Other embodiments of the invention will occur to those skilled in the art. For example, aspherical reference surface, $Z_R(r)$; $Z_a(r)$ and $Z_R(r)$ need not be rotationally symmetric, and the foregoing analysis can be applied to such non-rotationally symmetric aspherical surfaces as well. In the case of non-rotationally symmetric surfaces or wavefronts, the shape is given by, $Z_a(x, y)$, and the corresponding equations analogous to those derived for the symmetric case in connection with FIG. 2 are given by:

$$\tan \alpha_1 = \frac{\partial Z_a}{\partial x} \tag{3}$$

$$\tan \alpha_2 = \frac{\partial Z_a}{\partial y} \tag{4}$$

where $\alpha_1$ and $\alpha_2$ are the local slopes and the shape of the reference surface is:

$$Z_r(x, y) = Z_a(x + d \sin \alpha_1, y + d \sin \alpha_2) + d(1 - \sin^2 \alpha_2)^{1/2} \tag{5}$$

with:

$$\alpha_1 = \tan^{-1}\left(\frac{\partial Z_a}{\partial x}\right) \text{ and} \tag{6}$$

-continued $$\alpha_2 = \tan^{-1}\left(\frac{\partial Z_a}{\partial y}\right). \quad (7)$$

Figure 4:
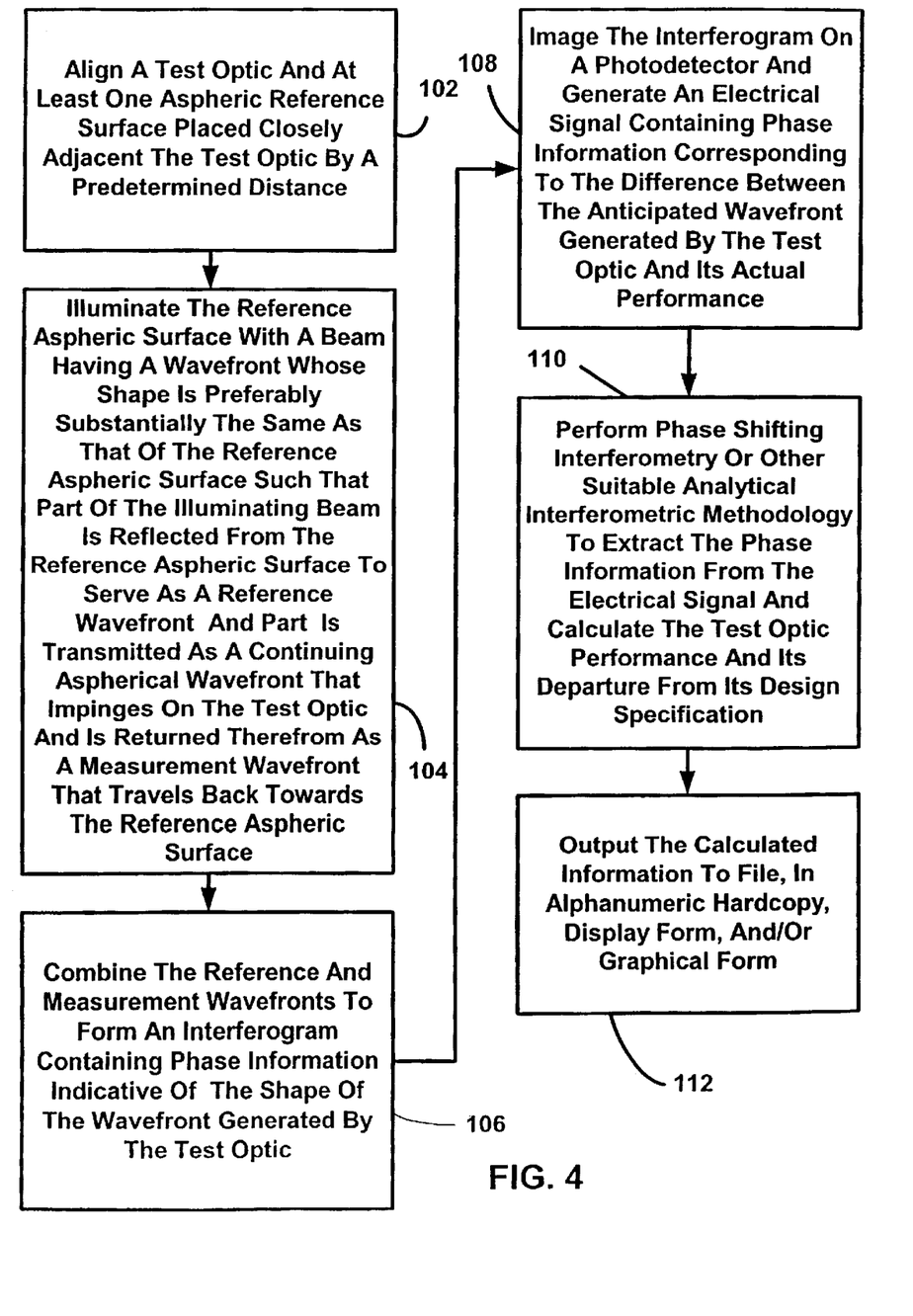
FIG. 4 is a flowchart of a method for practicing the invention as configured in FIG. 1.

Having described apparatus for practicing the invention, another aspect of the invention in the form of a method for its practice will now be described since the method may be carried out in interferometer architectures other than just Fizeau types. Referring now to FIG. 4, there is shown a flowchart illustrating various steps of a method for practicing the invention. As seen there, the method comprises the step of aligning a test optic and at least one aspheric surface reference surface placed closely adjacent the test optic by a predetermined distance (Block 102). As noted above, the test optic can be reflective or refractive or may be a group of refractive elements collectively acting to provide a transmitted aspherical wavefront output in accordance with its design specification as, for example, a compound lithographic lens for fabricating integrated circuits and the like.

As indicated in Block 104, this is followed by illuminating the reference aspheric surface with a beam having a well-defined wavefront whose shape is preferably substantially the same as that of the reference aspheric surface. The well-defined wavefront may be diverging or converging even though illustrated previously as diverging. The well-defined wavefront has part of it reflected from the reference aspheric surface to serve as a reference wavefront and part of it is transmitted through the reference aspheric surface as a continuing wavefront that impinges on the test optic (reflective or refractive, as the case may be) after which it is returned as a measurement wavefront that travels back towards the reference aspheric surface.

Next, the reference and measurement wavefronts are combined to form an interferogram containing phase information indicative of the shape of the wavefront generated by the test optic (Block 106). In the refractive case, a portion of the reference wavefront travels through the test surfaces, reflects from another reference surface, passes back through the test surfaces, and emerges as an aspherical wavefront to be analyzed.

An image of the interferogram is then formed on a photodetector and an electrical signal is generated containing phase information corresponding to the difference between the wavefront generated by test optic and its actual performance (Block 108).

Afterwards, phase shifting interferometry or other suitable analytical interferometric methodology is performed to extract the phase information from the electrical signal and calculate the test optic performance and its departure from its design specification (Block 110).

The calculated information is then outputted to file, as alphanumeric hardcopy display form, and/or graphical form (Block 112).

Figure 5:
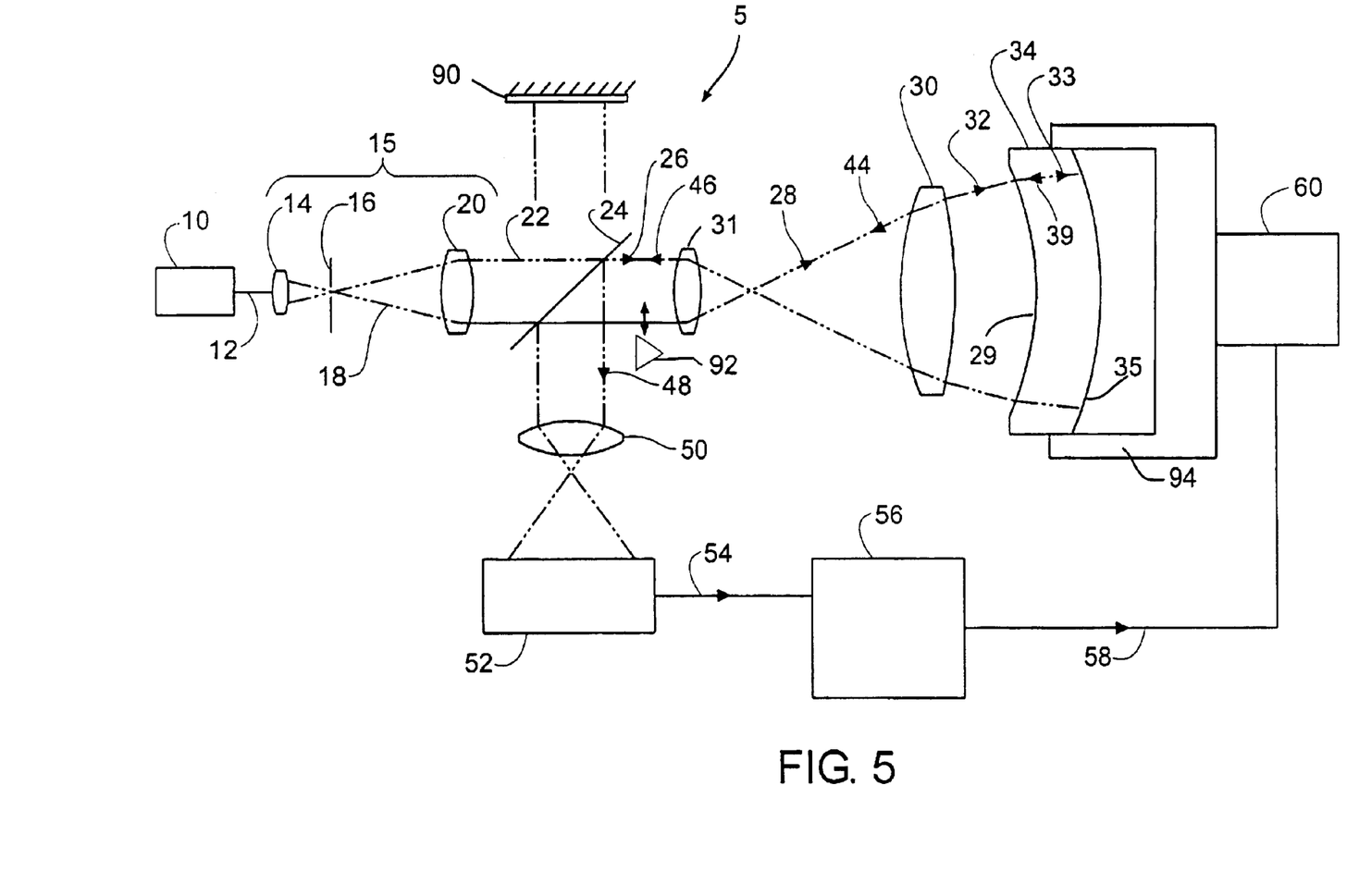
FIG. 5 is a diagrammatic view of apparatus illustrating a method for aligning the aspheric reference surface of FIG. 1 with the aspheric wavefront illuminating it.

Reference is now made to FIG. 5 which illustrates the apparatus of FIG. 1 configured to align the aspherical reference surface 35 with the wavefront 33 impinging on it. All elements of FIG. 1 reappearing here carry the same numerical identification as in FIG. 1.

A preferred method by which the system 5 in FIG. 5 is aligned for measuring reflecting aspheric surfaces first requires inserting a retroreflector 92 into the path of beam 26 (See the double arrow travel indicated) and hence its corresponding wavefront. A plane mirror 90 (Adjustments not shown) is then aligned to the wavefront from 92 using an interference pattern from wavefronts reflected from 90 and 92. This makes plane mirror 90 perpendicular to beam 26.

Next, retroreflector 92 is removed from the path of beam 26, element 34 is attached to positioning device 60 via a mounting bracket 94. Using positioning device 60, reflected wavefront 39 is aligned to plane mirror 90. The result of this alignment procedure assures that aspherical reference surface 35 is aligned with the wavefront of beam 26 so that reflecting aspheres may be accurately measured. The method by which system 5 is aligned for accurately measuring refracting optics using a "master" optic has been previously described.

Figure 6:
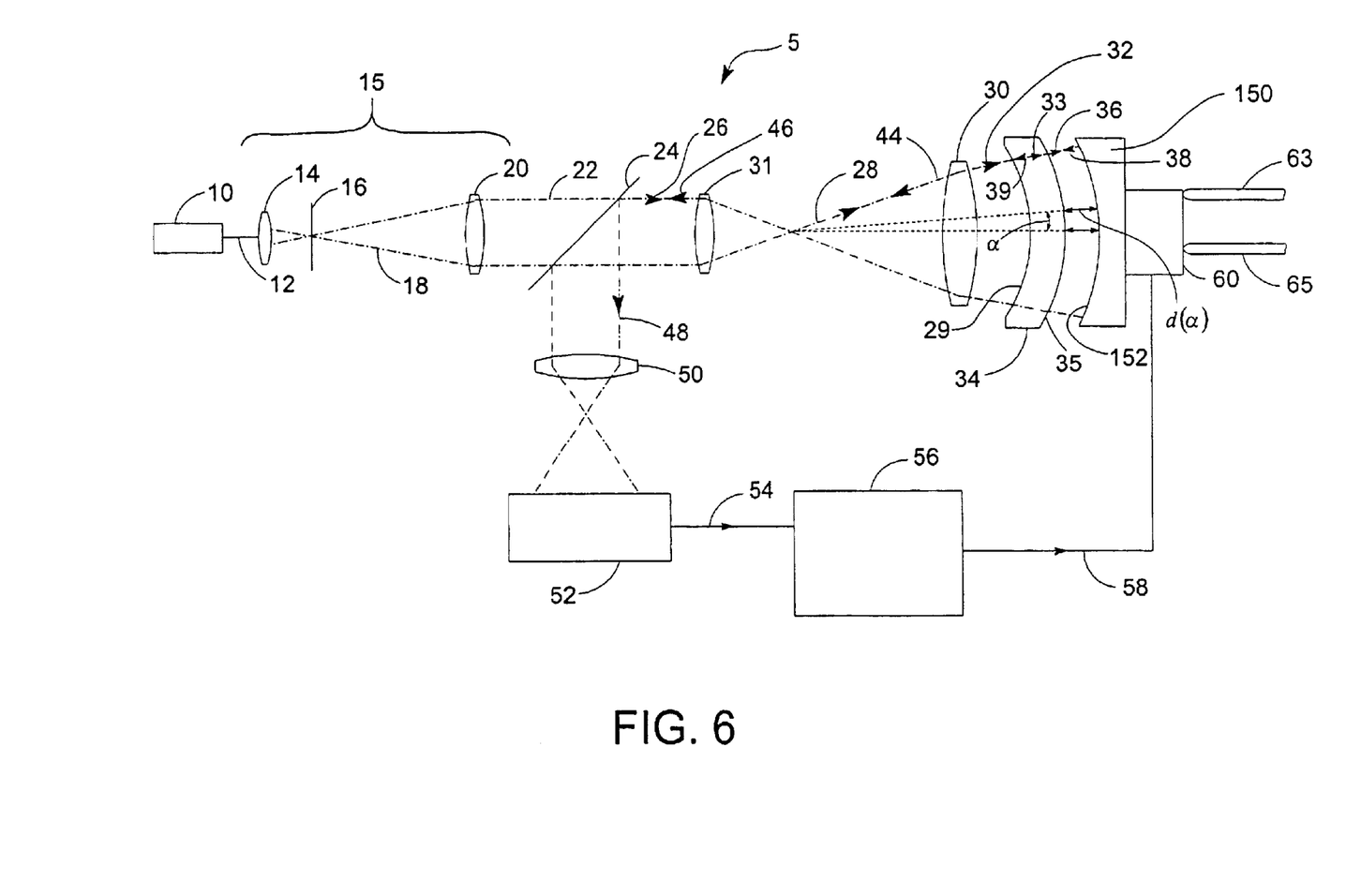
FIG. 6 is a diagrammatic view of the invention shown configured for characterizing an aspherical reference surface used to measure aspheric surfaces as shown in FIG. 1.

FIG. 6 shows the apparatus of FIG. 1 now set up with a spherical reference optic 150 having a spherical optic surface 152 known to the same precision as desired for making measurements in the previously described test mode of operation. Elements in common with those of FIG. 1 bear the same numerical identification as before. In this case, the gap d can be made to vary for scanning purposes by moving the spherical reference optic 150 relative to the aspheric reference surface 35 and precisely measuring the movement with the aid of DMIs 63 and 65. For a rotationally invariant (i.e., on-axis) aspheric reference surface 35 as shown here, d is a function solely of angle $\alpha$. For off-axis or anamorphic aspheric reference optics, the functional relationship will be move complex, but the measurement principle is unchanged.

To characterize the spherical reference surface, the 6-axis mount 80 is now scanned along the optical axis (i.e. in the z direction), and data is obtained at a number of positions following the method preferably as described in U.S. Provisional Patent Application No. 60/303,856 filed on Jul. 9, 2001 in the name of Michael Küchel and entitled "SCANNING INTERFEROMETER FOR ASPHERIC SURFACES AND WAVEFRONTS", now U.S. patent application Ser. No. 10/180,286 published on Mar. 6, 2003 as US-2003-0043385-A1, the entire contents of which are incorporated herein by reference, although other well known scanning zonal testing methods could be implemented. More particularly, reference may be had to pp 24–26 and FIGS. 24 and 25 for a detailed description of the Küchel methodology of Application No. 60/303,856 (US-2003-0043385-A1). Briefly, however, that method may be summarized as a scanning method for measuring rotationally and non-rotationally symmetric test optics having aspherical surfaces. The method comprises the steps of generating at least a partial spherical wavefront from a known origin along an optical axis; providing a spherical reference surface along said optical axis upstream of the known origin; aligning a test optic with respect to the optical axis and selectively moving the test optic along the optical axis relative to the known origin so that the spherical wavefront intersects the test optic at the apex of the aspherical surface at one or more radial positions where the spherical wavefront and the aspheric surface intersect at points of common tangency to generate an interferogram containing phase information about the difference in optical path length between the center of the test optic and the more than one radial positions; interferometrically measuring an axial distance, v, by which the test optic is moved with respect to the origin and calculating the optical path length difference, p, between the center of test optic and the radial positions based on the phase differences; calculating the coordinates of the aspherical surface wherever the circles of curvature have intersected the aspherical surface at common points of tangency and in correspondence with the interferometrically measured distance, v and calculated distance p; and determining the shape of the aspheric surface based on said coordinate values.

Figure 7:
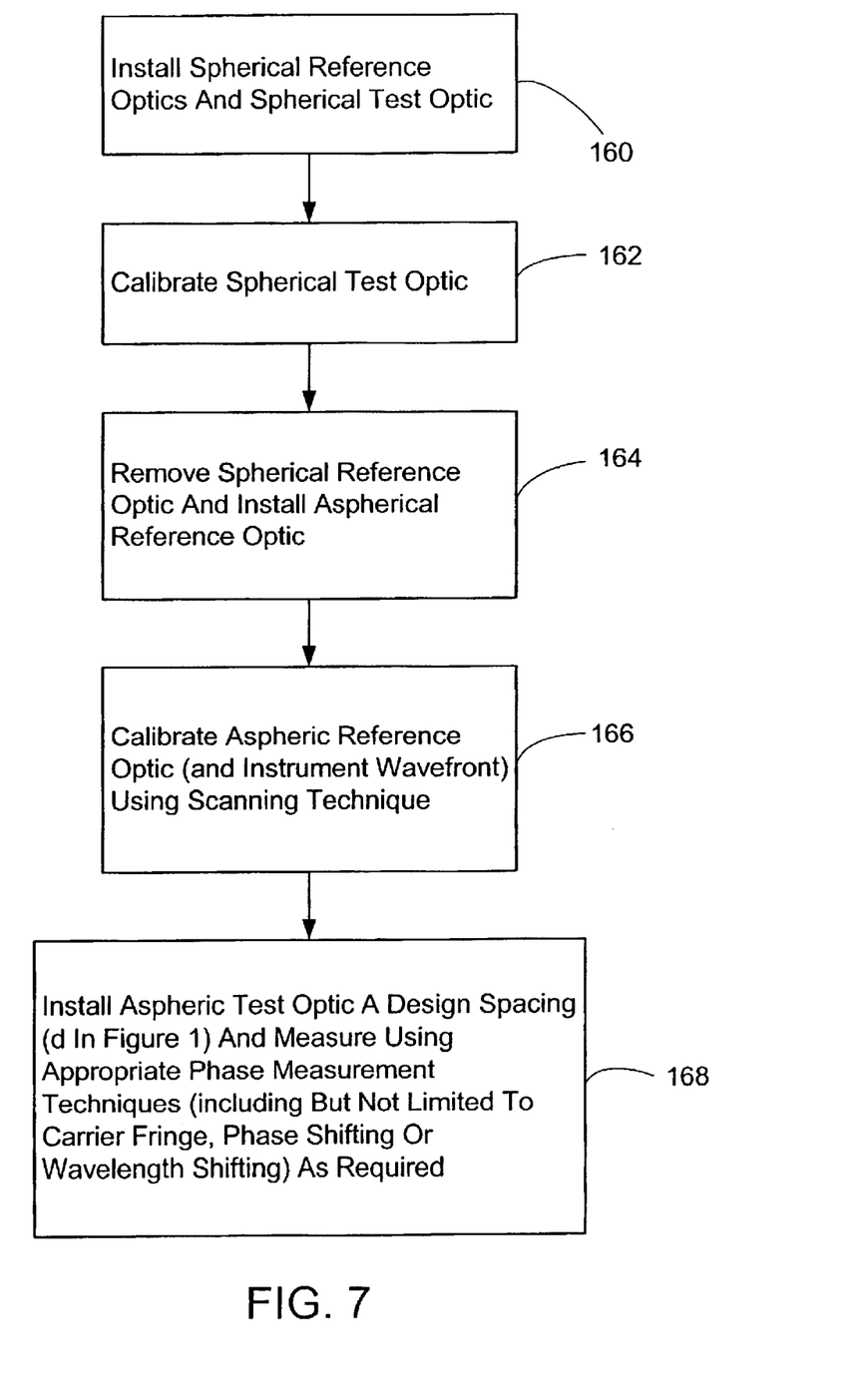
FIG. 7 is a flowchart of a method for practicing the invention.

A complete procedure for carrying out measurements with the apparatus of the invention operated in its calibration or "remastering" and measurement modes may be as illustrated in FIG. 7. In FIG. 7, the first step is to install spherical reference optics and spherical test optic as indicated in block 160. Next, a spherical test optic may be calibrated as shown in Block 162.

Next in Block 164, the spherical reference optic is removed and the aspherical reference optic is installed. This may be achieved with well-known handling equipment.

In Block 166, the aspheric reference optic is calibrated (and instrument wavefront) using scanning technique, preferably by use of '856 Provisional of Küchel.

Finally, in Block 168, the aspheric test optic is installed with a design spacing (d in FIG. 1) and measurements are made using appropriate phase measurement techniques (including but not limited to carrier fringe, phase shifting or wavelength shifting) as required.

Based on experience and required uncertainty in the measurements, the instrument operator may choice to repeat Block 166 periodically. Concern over the stability of the spherical test surface may also provoke instrument operators to repeat the entire sequence periodically.

The principal advantages of the invention is that it results in an instrument that is self-calibrating and the aspheric interferometer is calibrated in-situ in the configuration in which it is used to measure production parts.

Other variations of the invention will occur to those skilled in the art based on its teachings. For example, it will be evident that the reference aspheric surfaces may be simulated at least in part by their holographic equivalent. Therefore, it is intended that all such variations be within the scope of the invention.

What is claimed is:

1. An interferometric method for measuring rotationally and non-rotationally symmetric optics, said interferometric method comprising the steps of:
   scanning at least one aspheric reference surface with a spherical reference surface to determine the shape of said aspheric reference surface;
   aligning a test optic to be measured with said aspheric reference surface placed closely adjacent the test optic by a predetermined distance;
   illuminating said at least one reference aspherical surface with a beam having a predetermined wavefront such that part of said predetermined wavefront is reflected from said reference aspherical surface to serve as reference wavefront and part is transmitted as a continuing aspherical wavefront that impinges on the said test optic and returns therefrom as a measurement wavefront that travels back towards said reference aspherical surface; and
   combining said reference and measurement wavefronts to form an interferogram containing phase information indicative of the shape of the wavefront generated by the test optic.

2. The interferometric method of claim 1 further including the step of imaging said interferogram onto a photodetector and generating an electrical signal containing phase information corresponding to the difference between the shape of the anticipated wavefront generated by the test optic and its actual performance.

3. The interferometric method of claim 2 further including the step of performing phase shifting interferometry to extract said phase information from said electrical signal and calculate the test optic performance.

4. The interferometric method of claim 3 further including the step of outputting said calculated information in one or more of a file, alphanumeric hardcopy, display, and graphic.

5. The interferometric method of claim 1 wherein said test optic is a rotationally symmetric aspherical reflective surface and said reference aspherical surface has a shape of the form:

$$Z_r(r) = Z_a(r + d \sin \alpha) + (d \cos \alpha)$$

where d is the distance separating said reference aspherical surface and said test aspherical surface, $Z_a$ is the shape of the test aspherical surface as a function of r, and $\alpha$ is the local slope of the reference and test aspherical surfaces at normal incidence and is given by $$\alpha = \tan^{-1}\left(\frac{dZ_a(r)}{dr}\right).$$

6. The interferometric method of claim 1 wherein said test optic is a non-rotationally symmetric aspherical reflective surface and said reference aspherical surface has a shape of the form:

$$Z_r(x, y) = Z_a(x + d \sin \alpha_1, y + d \sin \alpha_2) + d(1 - \sin^2 \alpha_1 - \sin^2 \alpha_2)^{1/2}$$

where d is the distance separating said reference aspherical surface and said test aspherical surface, $Z_a$ is the shape of the test aspherical surface as a function of r, and $\alpha_1$ and $\alpha_2$ are the local slopes of the reference and test aspherical surfaces at normal incidence and are given by:

$$\alpha_1 = \tan^{-1}\left(\frac{\partial Z_a}{\partial x}\right) \text{ and } \alpha_2 = \tan^{-1}\left(\frac{\partial Z_a}{\partial y}\right).$$

7. The interferometric method of claim 1 wherein said test optic is refractive and said reference aspherical surface comprises at least two reference aspherical surfaces one each of which is located on either side of said refractive test optic.

8. Interferometric apparatus for measuring rotationally and non-rotationally symmetric test optics, said interferometric apparatus comprising:
   means for mounting a test optic to be measured so that it can be illuminated as it is precisely aligned;
   means for scanning an aspheric reference surface to precisely determine its shape;
   means for aligning said reference aspherical surface closely adjacent said test optic to be measured and spaced therefrom by a predetermined distance; and
   means for illuminating said reference aspherical surface with a beam having a predetermined wavefront whose shape is substantially the same as that of said reference aspherical surface so that part of said predetermined wavefront is reflected from said reference aspherical surface to serve as reference wavefront and part is transmitted as a continuing aspherical wavefront that impinges on the said test optic and returns therefrom as a measurement wavefront that travels back towards said reference aspherical surface, said reference and measurement wavefronts combining to form an interferogram containing phase information indicative of the shape of the wavefront generated by the test optic.

9. The interferometric apparatus of claim 8 further including means for imaging said interferogram onto a photodetector and generating an electrical signal containing phase information corresponding to the difference between the anticipated shape of the wavefront generated by the test optic and its actual performance.

10. The interferometric apparatus of claim 9 further including means for performing phase shifting interferometry to extract said phase information from said electrical signal and calculate the test optic performance.

11. The interferometric apparatus of claim 10 further including means for outputting said calculated information in one or more of a file, alphanumeric hardcopy, display, and graphic.

12. The interferometric apparatus of claim 8 wherein said test optic is a rotationally symmetric reflective aspherical surface and said reference aspherical surface has a shape of the form:

$$Z_r(r)=Z_a(r+d \sin \alpha)+(d \cos \alpha)$$

where d is the distance separating said reference aspherical surface and said test aspherical surface, $Z_a$ is the shape of the test aspherical surface as a function of r, and $\alpha$ is the local slope of the reference and test aspherical surfaces at normal incidence and is given by $$\alpha = \tan^{-1}\left(\frac{dZ_a(r)}{dr}\right).$$

13. The interferometric apparatus of claim 8 wherein said test optic is a non-rotationally symmetric aspherical reflective surface and said reference aspherical surface has a shape of the form:

$$Z_r(x, y)=Z_a(x+d \sin \alpha_1, y+d \sin \alpha_2)+d(1-\sin^2 \alpha_1-\sin^2 \alpha_2)^{1/2}$$

where d is the distance separating said reference aspherical surface and said test aspherical surface, $Z_a$ is the shape of the test aspherical surface as a function of r, and $\alpha_1$ and $\alpha_2$ are the local slopes of the reference and test aspherical surfaces at normal incidence and are given by:

$$\alpha_1 = \tan^{-1}\left(\frac{\partial Z_a}{\partial x}\right) \text{ and } \alpha_2 = \tan^{-1}\left(\frac{\partial Z_a}{\partial y}\right).$$

14. The interferometric apparatus of claim 8 wherein said test optic is refractive and said reference aspherical surface comprises at least two reference aspherical surfaces one each of which is located on either side of said refractive test optic.

15. The interferometric apparatus of claim 13 further including means for aligning said reference aspheric surface with said illuminating predetermined wavefront at least prior to measuring a test reflective aspheric surface.

* * * * *